United States Patent
Schwarz et al.

(10) Patent No.: US 11,418,205 B1
(45) Date of Patent: Aug. 16, 2022

(54) SYSTEM AND METHOD OF FN-PLL WITH MULTI MODULUS DIVIDER

(71) Applicant: Infineon Technologies AG, Neubiberg (DE)

(72) Inventors: Andreas Schwarz, Oepping (AT); Dmytro Cherniak, Villach (AT); Luigi Grimaldi, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 17/208,761

(22) Filed: Mar. 22, 2021

(51) Int. Cl.
| | |
|---|---|
| H03D 3/24 | (2006.01) |
| H03L 7/197 | (2006.01) |
| H03L 7/099 | (2006.01) |
| H03L 7/093 | (2006.01) |

(52) U.S. Cl.
CPC ............ *H03L 7/1978* (2013.01); *H03L 7/093* (2013.01); *H03L 7/0992* (2013.01); *H03L 2207/50* (2013.01)

(58) Field of Classification Search
CPC ..... H03L 7/1978; H03L 7/0992; H03L 7/093; H03L 2207/50; H03L 7/081; H03L 7/1916; H03L 7/1914; H03L 7/23; H03C 3/0925
USPC .................................................. 375/373–376
See application file for complete search history.

(56) References Cited

U.S. PATENT DOCUMENTS

| | | | |
|---|---|---|---|
| 7,181,180 B1* | 2/2007 | Teo ....................... | H03L 7/1976 375/376 |
| 7,312,642 B1* | 12/2007 | Li ............................. | H03L 7/23 327/147 |
| 9,020,089 B2 | 4/2015 | Da Dalt | |
| 9,740,175 B2 | 8/2017 | Burg et al. | |
| 9,843,334 B2* | 12/2017 | Weberg ................. | H03L 7/1974 |
| 10,205,459 B2* | 2/2019 | Huang .................... | H03L 7/081 |
| 2005/0280473 A1* | 12/2005 | Puma ................... | H03C 3/0925 331/16 |
| 2018/0175868 A1 | 6/2018 | Stuhlberger et al. | |

OTHER PUBLICATIONS

Benachour, Abdelaziz et al., "A 1.5GHz, Sub-2mW CMOS Dual Modulus Prescaler", IEEE Custom Integrated Circuits Conference (Cat. No. 99CH36327), May 19, 1999, 4 pages.
Gu, Qun Jane et al., "A CMOS High Speed Mult-Modulus Divider with Retiming for Jitter Suppression", IEEE Microwave and Wireless Components Letters, vol. 23, No. 10, Oct. 2013, 3 pages.
(Continued)

*Primary Examiner* — Phuong Phu
(74) *Attorney, Agent, or Firm* — Slater Matsil, LLP (57) ABSTRACT

In accordance with an embodiment, a method of operating a fractional-N phase locked loop (FN-PLL) includes: dividing a first clock signal using a multi-modulus divider (MMD) based on a modulus control signal to form a frequency-divided clock signal, where the first clock signal is based on an output clock of the PLL; generating the modulus control signal based on a divider control input value using a delta-sigma modulator (DSM); and when a fractional portion of the divider control input value is within a first range of values, and repeatedly removing a first number of clock cycles from the first clock signal before dividing the first clock signal using the MMD, where the first number of clock cycles is a non-integer number of clock cycles.

22 Claims, 5 Drawing Sheets

(56) References Cited

OTHER PUBLICATIONS

Hu, Ang et al., "A 0.045-to 2.5 GHz Frequency Synthesizer with TDC-Based AFC and Phase Switching Multi-Modulus Driver", IEEE Transactions on Circuits and Systems—I: Regular Papers, vol. 67, No. 12, Dec. 2020, 14 pages.

Jin, Jing et al., "Quantization Noise Suppression in Fractional-N PLLs Utilizing Glitch-Free Phase Switching Multi-Modulus Frequency Divider", IEEE Transactions on Circuits and Systems—I: Regular Papers, vol. 59, No. 5, May 2012, 12 pages.

Kennedy, Michael Peter, "An Introduction to Digital Delta-Sigma Modulators—Circuits and Systems Group", IEEE Circuits and Systems Society, Santa Clara Valley Chapter, School of Engineering—Electrical & Electronic Engineering University College, Cork, and Tyndall National Institute, Cork, Ireland, Jul. 28, 2014, 125 pages.

Perrott, Michael H., "Tutorial on Digital Phase-Locked Loops", CICC 2009, Sep. 2009, 118 pages.

\* cited by examiner

SYSTEM AND METHOD OF FN-PLL WITH MULTI MODULUS DIVIDER

TECHNICAL FIELD

The present invention relates generally to an electronic system, and, in particular embodiments, to a system and method of a fractional-N PLL with a multi-modulus divider.

BACKGROUND

Phase locked loops (PLLs) are ubiquitously used in radio frequency (RF) circuits. PLLs generally include an oscillator that provides a high frequency periodic signal, a divider circuit that divides the high frequency periodic into a lower frequency signal, a phase detector that compares the phase of lower frequency signal with a phase of a reference clock, and a loop filter that filters the output of the phase detector to provide a signal used to tune the oscillator. When the divider of the PLL is provides an integer division ratio, the oscillator is tunable in increments equal to the frequency of the reference clock. For example, if a reference clock of 1 MHz is used, the oscillator is tunable in 1 MHz increments. For example, a division ratio of 1000 yields an output frequency of 1 GHz, while a division ration of 1001 yields an output frequency of 1.001 GHz.

A finer output frequency resolution can be achieved by alternating between different divider ratios during operation. For example, a resolution of 500 KHz can be achieved by alternating between adjacent integer division ratios such each adjacent division ratios are used 50% of the time. Even finer division ratios are achievable by controlling proportion of time that is spent at each division ratio. A PLL that uses this technique is generally referred to as a fractional-N PLL (FN-PLL). While the mechanism of alternating between different division ratios provides higher output frequency resolution, this alternation potentially produces unwanted spurious frequency components. Managing the generation of these unwanted spurious frequency components is a challenging aspect of fractional-N PLL design.

SUMMARY

In accordance with an embodiment, a method of operating a fractional-N phase locked loop (FN-PLL) includes: dividing a first clock signal using a multi-modulus divider (MMD) based on a modulus control signal to form a frequency-divided clock signal, where the first clock signal is based on an output clock of the PLL; generating the modulus control signal based on a divider control input value using a delta-sigma modulator (DSM); and when a fractional portion of the divider control input value is within a first range of values, and repeatedly removing a first number of clock cycles from the first clock signal before dividing the first clock signal using the MMD, where the first number of clock cycles is a non-integer number of clock cycles.

In accordance with another embodiment, a phase locked loop (PLL) includes: a clock modification circuit having an input coupled to a clock output of the PLL, the clock modification circuit configured to remove a non-integer number of clock cycles from an input clock signal at its input based on a clock modification control signal; a multi-modulus divider (MMD) having an input coupled to an output of the clock modification circuit; a delta-sigma modulator (DSM) having an output coupled to a modulus control input of the MMD and an input configured to receive a divider input control value; an operating point modification circuit coupled to the DSM; and a controller configured to repeatedly assert the clock modification control signal when a fractional component of the divider input control value is within a first range of values, and to cause the operating point modification circuit adjust an operating point of the DSM to compensate for the removed non-integer number of clock cycles.

In accordance with a further embodiment, a phase locked loop (PLL) includes: a phase comparison circuit configured to receive a reference clock signal at a first input; a filter coupled to an output of the phase comparison circuit; an oscillator having a frequency control input coupled to an output of the filter; a prescaler circuit coupled to an output of the oscillator; a clock synchronizer circuit coupled to the prescaler circuit, the clock synchronizer circuit configured to switch between a non-inverted output of the prescaler circuit and an inverted output of the prescaler circuit; a multi-modulus divider (MMD) having an input coupled to an output of the clock synchronizer circuit and an output coupled to a second input of the phase comparison circuit; a delta-sigma modulator (DSM) having an output coupled to a modulus control input of the MMD and configured to receive a divider input control signal; and a controller configured to, when the divider input control signal is within a first predetermined range of values, repeatedly cause the clock synchronizer circuit to switch between the non-inverted output of the prescaler circuit and the inverted output of the prescaler circuit, and add a non-integer offset to the divider input control signal received by the MMD.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In an embodiment, a fractional-N PLL is implemented using multi-modulus divider (MMD) whose modulus is controlled by an oversampled modulator, such as a digital multi-stage noise shaping (MASH) delta-sigma modulator. The effect of integer boundary spurs are advantageously reduced by eliminating a non-integer number of clock cycles from clock provided to the MMD and providing a corresponding non-integer shift in the operating point of the oversampled modulator whenever the division ratio is close to an integer boundary. Embodiment concepts may be applied to various PLL implementations including PLLs that utilize analog loop filters and oscillators tuned using analog signals, and PLLs that utilize digital loop filters and digitally controller oscillators (DCOs), otherwise known as all-digital PLLs (ADPLLs).

Figure 1A:
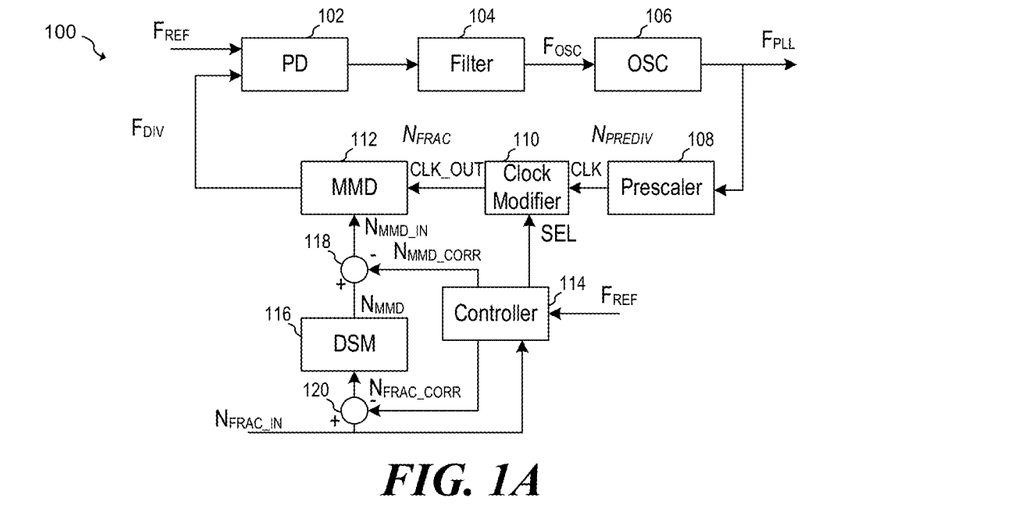
FIG. 1A illustrates a block diagram of a fractional-N PLL (FN-PLL) according to an embodiment.

FIG. 1A illustrates a FN PLL 100 according to an embodiment of the present invention. As shown, FN-PLL 100 includes a phase detector 102, a loop filter 104, an oscillator 106, a prescaler 108, a clock modifier 110, and a multi-modulus divider (MMD) 112. During operation, phase detector 102 (also referred to as a "phase comparison circuit") compares the phase of reference clock $F_{REF}$ with the phase of divided clock $F_{DIV}$ (also referred to as a "frequency-divided clock signal") to form a phase comparison signal, which is filtered by loop filter 104. A frequency control signal $F_{OSC}$ produced by filter 104 is used to control the frequency of oscillator 106, which produces output signal $F_{PLL}$. In some embodiments, FN-PLL 100 may be implemented as an analog PLL where phase detector 102 is implemented using a phase-frequency detector (PFD) and a charge pump, loop filter 104 is implemented using an analog filter, such as an RC filter, and oscillator 106 is implemented using an oscillator having an analog frequency control input, such as a voltage controlled oscillator (VCO). In other embodiments, FN-PLL 100 may be implemented as an all-digital PLL (ADPLL) in which phase detector 102 is implemented using a time-to-digital converter (TDC), loop filter 104 is implemented using a digital filter, and oscillator 106 is implemented using a digitally controlled oscillator (DCO). Prescaler 108 (also referred to as a "prescaler circuit") divides the frequency of $F_{PLL}$ by a prescaling factor of $N_{PREDIV}$, and the output of prescaler 108 is divided by a further factor of $N_{FRAC}$ via MMD 112. Thus, the output frequency $f_{PLL}$ of PLL 100 can be expressed as:

$$f_{PLL} = N_{FRAC} \cdot N_{PREDIV} \cdot f_{REF},$$

where $f_{REF}$ is the frequency of reference clock $F_{REF}$.

In various embodiments, MMD 112 is implemented as a divider that is configured to divide a clock by at least two different integer division ratios. In order to achieve a fractional division ratio, the modulus is changed or modulated during operation of the PLL to achieve a desired average division ration. The division ratio may be controlled by input signal $N_{MMD\_IN}$ (also referred to as a "modulus control signal") coupled to a modulus control input of MMD 112. For example, for an MMD having selectable division ratios of m and 1+m, a division ratio of 1.5 m is achievable by operating the MMD at a division ratio of m for 50% of the time, and at a division ratio of m+1 for 50% of the time. Similarly, a division ratio of 1.25 m is achievable by operating the MMD at a division ratio of m for 75% of the time, and at a division ratio of m+1 for 25% of the time.

One consequence of changing the division ratio of MMD 112 during operation is that spurious energy in the form of fractional spurs are generated. By using a delta-sigma modulator 116, the spurious energy may be spread over multiple frequencies and pushed to higher frequencies due to the noise shaping properties of the delta-sigma modulator. Depending on how the PLL is designed, much of this noise-shaped spurious energy may be pushed above the bandwidth of the PLL such that fractional spurs are significantly attenuated. In various embodiments, delta-sigma modulator 116 may be implemented using digital delta-sigma modulator architectures known in the art. For example, in one embodiment, a third-order multistage noise shaping (MASH) delta-sigma modulator architecture is used to implement DSM 116. Alternatively, delta-sigma modulators of orders besides three and/or delta-sigma modulators having non-MASH architectures may be used.

As the fractional division ratio approaches an integer division ratio, an increased amount of low-frequency spurious energy may be generated within the loop bandwidth of the PLL. The generation of this increased low-frequency spurious energy, which is commonly known as "integer boundary spurs," may be understood by considering that MMD 112 changes division ratios less frequently when the fractional division ratio is close to an integer. For example, for a division ratio of 1.01 m, MMD 112 operates at a division ratio of m for 99% of the time, and operates at a division ratio only 1% of the time, thereby creating increased low frequency spurious energy.

In an embodiment of the present invention, the effect of integer boundary spurs is reduced by shifting the operating point of DSM 116 for fractional ratios that are within a predetermined range of an integer. For example, for a desired fractional division ratio $N_{FRAC\_IN}$ of m+0.01, where m is an integer, instead of configuring DSM 116 to produce an output of m+0.01, the input to DSM 116 is offset by a fractional amount, such as −0.5, such that that an output of m−0.51 (instead of m+0.01) is provided to MMD 112. Desired fractional division ratio $N_{FRAC\_IN}$ may also be referred to as a divider input control value or divider input control signal. Since the DSM produces less low frequency energy with an input of m−0.51 that it does with an input 1 m+0.01, the low frequency spurious energy produced by FN-PLL is reduced. The additional fractional offset provided to MMD 112 is compensated by removing a corresponding non-integer number of clock cycles from a group of cycles of the input clock input to MMD 112 using clock modifier 110. For example, in a "binary clock system" that has 0/180 degree phase offset (e.g. CLK and inverted CLK), in order to compensate for the additional fractional offset of −0.5, a half clock cycle may be removed in each period (also referred to as a "reference clock interval") of reference clock $F_{REF}$ by eliminating one clock transition from the output of prescaler 108. Generally, removing an integer number of clock cycles involves removing an even number of clock transitions (e.g. the same number of rising edges and falling edges) from the clock signal, and removing a non-integer number of clock cycles involves removing an odd number of clock transitions (e.g. a different number of rising edges and falling edges) from the clock signal. For example in order to remove 1.5 cycles from a group of cycles, two falling edges and one rising edge may be removed or two rising edges and one falling edge may be removed. In order to remove 3.5 cycles from a group of cycles, three falling edges and four rising edges may be remove or three rising edges and four falling edges may be removed.

In various embodiments, "binary clock system" that has 0/180 degree phase offset (e.g. CLK and inverted CLK) at the input to MMD 112, non-integer clock cycles in units of 0.5 can be removed by removing edges or by toggling between CLK and an inverted version of CLK (e.g. CLKB) as discussed below with respect to FIGS. 3A and 3B. It should be understood, however that a non-integer number of clock cycles in units different from 0.5 could also be removed. For example, in a "quarter clock system" that has a 90 degree phase offset between clocks at the input to MMD 112, removing a clock edge, or toggling between clocks results in the removal of a non-integer number of clock cycles in units of 0.25. In general, the units of non-integer phase shift achievable can be represented as $\varphi_{ps}/360$, where $\varphi_{ps}$ is the phase shift between clocks provided to MMS 112 in degrees.

Thus, by offsetting the operation of DSM 116 and removing a non-integer number of clock cycles from the output of prescaler 108, a reduction in low frequency spurious energy may be achieved for factional ratios in close proximity to an integer ratio.

In various embodiments, the additional offset may be introduced by adding at least a non-integer offset $N_{FRAC\_CORR}$ to the desired fractional offset $N_{FRAC\_IN}$ using summer 120 (also referred to as a summing circuit). An additional integer offset $N_{MMD\_CORR}$ may also be added to the output $N_{MMD}$ of DSM 116 using summer 118 to produce MMD input $N_{MMS\_IN}$. Summer 120 and/or 118 may be also referred to as an operating point modification circuit. In various embodiments, summers 118 and 120 may be implemented using digital summing circuits known in the art, such as digital adders or subtractors.

Figure 1B:
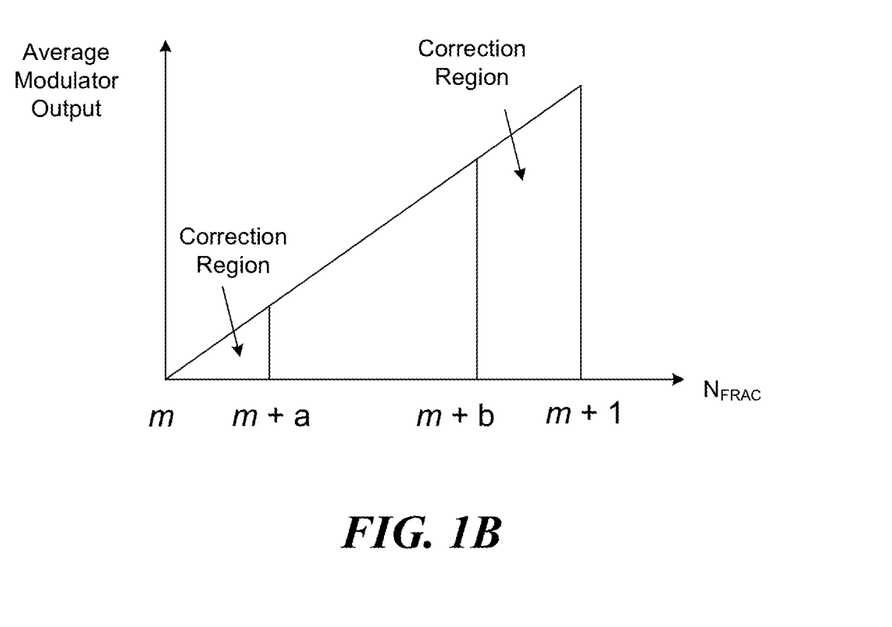
FIG. 1B illustrate a graph of correction regions for the FN-PLL of FIG. 1A.

In various embodiments, controller 114 determines the amount of offset to apply to fractional offset $N_{FRAC\_CORR}$ and integer offset $N_{MMD\_CORR}$ based on the desired fractional division ratio $N_{FRAC\_IN}$, according to the graph of FIG. 1B, which represents the average modulator output for inputs between m and m+1. For the purpose of discussion herein, desired fractional offset $N_{FRAC\_IN}$ may be represented as m+fr, where m is an integer representing an integer component of $N_{FRAC\_IN}$, and fr is a fraction between 0 and 1 representing a fractional component of $N_{FRAC\_IN}$. For example, if $N_{FRAC\_IN}$ has a value of 13.4, integer component m=13 and fractional component fr=0.4.

As shown in the graph of FIG. 1B, the region between m and m+1 is further divided into a first regions between m and m+a, a second region between m+a and m+b, and a third region between m+b and m+1, where a and b represent specific values of the fractional component fr of $N_{FRAC\_IN}$ between 0 and 1, where b>a. Value a may be referred to as a first fractional limit value and value b may be referred to as a second fractional limit value.

In various embodiments, controller 114 applies an offset to DSM 116 that has at least a non-integer component. In some embodiments, the offset may also include an integer component. Controller 114 applies an offset $N_{FRAC\_CORR}$ having at least a fractional component to summer 120 coupled to the input of DSM 116 when the fractional portion fr of the desired fractional division ratio $N_{FRAC\_IN}$ is either between zero and first fractional limit value a, or between second fractional limit value b and one. In other words, controller 114 applies at least a offset $N_{FRAC\_CORR}$ to summer 120 when desired fractional division ratio $N_{FRAC\_IN}$ is between m and m+a, or between m+b and m+1. Otherwise, offset $N_{FRAC\_CORR}$ is set to zero (e.g. when N-$F_{RAC\_IN}$ is between m+a and m+b). In some embodiments, offset $N_{FRAC\_CORR}$ is configured to have only a non-integer component. Alternatively, offset $N_{FRAC\_CORR}$ may include both a non-integer and an integer component. In some embodiments, controller 114 may offset the output of DSM by an integer component via signal $N_{MMD\_CORR}$ and summer 118.

In one specific example first fractional limit value a may be set to 0.25, and second fractional limit value b may be set to 0.75. Alternatively, first fractional limit value a and second fractional limit value b may be set to other fractional values between 0 and 1 where b>1. In some embodiments, first fractional limit value a and second fractional limit value b may be modified during operation. For example, these fractional limit values may be modified to provide hysteresis as the fractional portion fr of the desired fractional division ratio $N_{FRAC\_IN}$ enters and leaves the correction regions. The fractional offset $N_{FRAC\_CORR}$ may be optionally applied and clock modifier 110 optionally enabled when the fractional value is zero. Alternatively, controller 114 may be configured to set $N_{FRAC\_CORR}$ to zero and disable clock modifier 110 when the fractional value is zero.

Figure 1C:
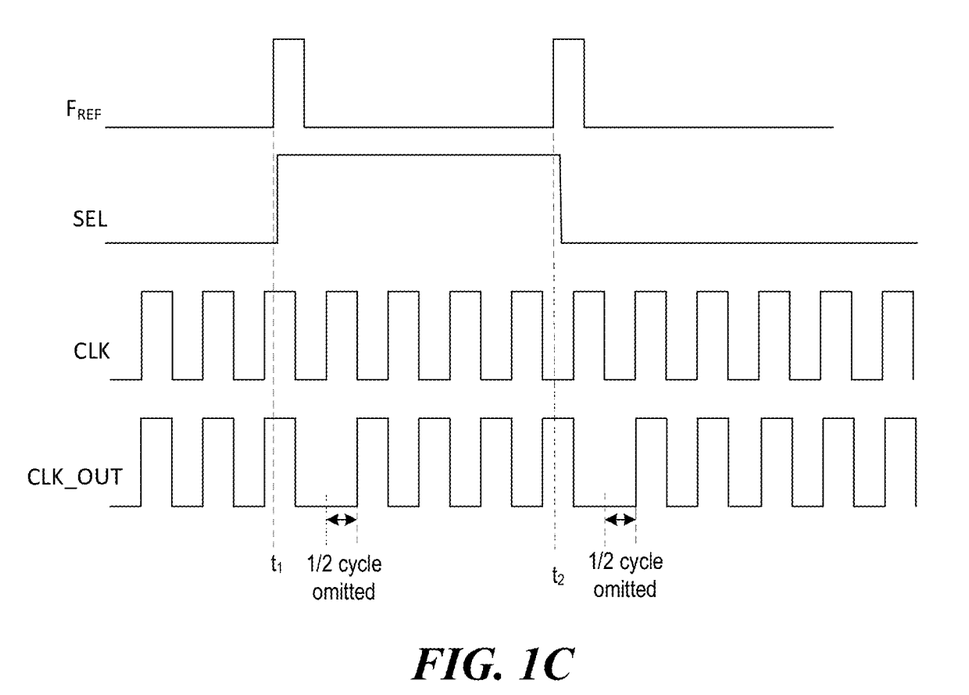
FIG. 1C illustrated a timing diagram of a clock modifier circuit of the FN-PLL of FIG. 1A.

FIG. 1C illustrates a timing diagram showing the operation of controller 114 and clock modifier 110 according to an embodiment when clock modifier 110 is configured to modify the clock signal provided to MMD 112. As shown, FIG. 1C shows reference clock $F_{REF}$, select signal SEL (also referred to as a "clock modification control signal") produced by controller 114 and input to clock modifier 110 (also referred to as a "clock modification circuit"), input clock signal CLK provided to clock modifier 110 from prescaler 108, and output clock signal CLK_OUT provided by clock modifier 110 to MMD 112. As shown, select signal SEL changes state in response to reference clock signal $F_{REF}$ being asserted at time $t_1$. As a result of select signal SEL changing state (e.g. changes polarity), clock modifier 110 eliminates an edge transition from output clock signal CLK_OUT, which results in one-half of a clock cycle being eliminated from output clock signal CLK_OUT. As can be observed from FIG. 1C, in view of the elimination of fractional clock cycles, after the first elimination of clock cycles, rising edges of the input clock signal are output as falling edges and falling edges of the input clock signal are output as rising edges. This corresponds to a phase shift of 180°. When the reference clock $F_{REF}$ is again asserted at time $t_2$, select signal SEL again changes state, which causes clock modifier 110 to eliminate a further edge transition from output clock signal CLK_OUT. Operation continues in this manner at each successive assertion of reference clock signal $F_{REF}$ when controller 114 configures clock modifier 110 to eliminate fractional clock cycles (e.g., when the desired fractional division ratio $N_{FRAC\_IN}$ is between m and m+a, or between m+b and m+1). When controller 114 does not cause clock modifier 110 to eliminate fractional clock cycles (e.g., when the desired fractional division ratio $N_{FRAC\_IN}$ is between m+a and m+b), select signal SEL does not change state or polarity in response to clock signal $F_{REF}$. It is to be noted that the difference of t1 and t2 defines the group of cycles from which the number of clock cycles (here ½ clock cycle) is omitted.

It should be understood that the operation of controller 114 and clock modifier 110 illustrated in FIG. 1C is just one of many possible ways of removing fractional clock cycles. In alternative embodiments, other methods of signaling clock modifier 110 to remove fractional clock cycles besides changing the state of select signal SEL may be used. For example, controller 114 may provide a gated version of reference clock signal $F_{REF}$, or may provide other methods of signaling. In some embodiments, clock modifier 110 may remove an integer number of clock cycles in addition to the half-cycle shown in FIG. 1C for each reference clock cycle. In such embodiments, an additional corresponding offset may be provided to the input or the output of DSM 116. For example, if 1.5 clock cycles are removed from clock signal CLK_OUT, an offset of −1.5 may be provided DSM 116 via summer 120 by setting $N_{FRAC\_CORR}$. Alternatively, an offset of −0.5 may be provided to summer 120 coupled to the input of DSM 116 by setting $N_{FRAC\_CORR}$ to 0.5, and an additional integer offset of 1 may be provided to the output of DSM 116 via summer 118 coupled to the input of MMD 112 by setting $N_{MMD\_CORR}$ to 1. Thus, in some embodiments, $N_{FRAC\_CORR}$ may be set to have a fractional offset and $N_{MMD\_CORR}$ may be set to have an integer offset in manner that corresponds with the number of clock cycles removed from CLK_OUT by clock modifier 110.

While the embodiments described above with respect to FIGS. 1A and 1C specify that clock modifier removes a particular non-integer number of clock cycles during each cycle of reference clock $F_{REF}$, it should be understood that in alternative embodiments, the non-integer number of clock cycles could also be removed by clock modifier 110 each time MMD 112 reaches a terminal count.

Figure 2A:
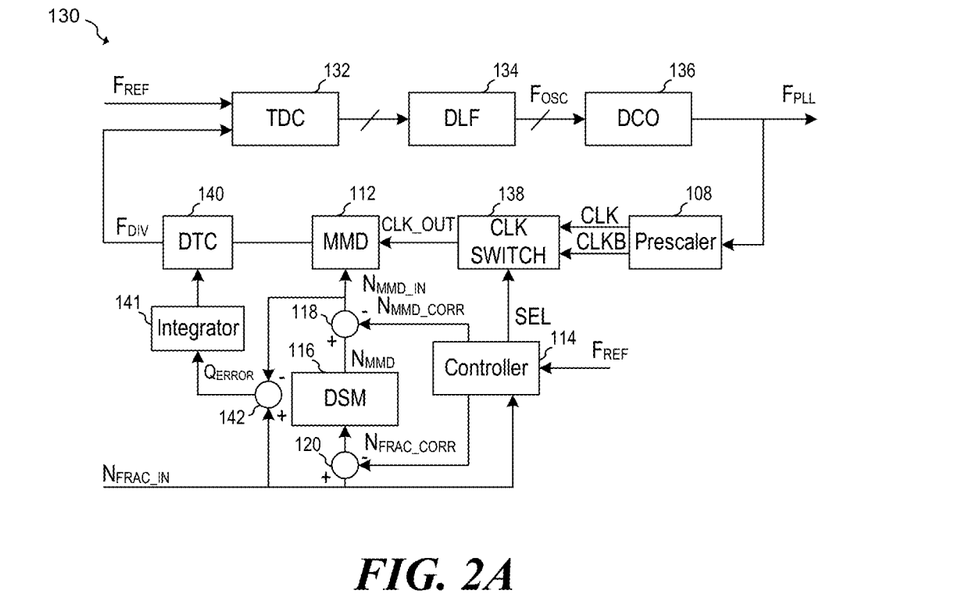
FIGS. 2A and 2B illustrate block diagrams of all digital PLLs (ADPLLs) according to embodiments.
Figure 2B:
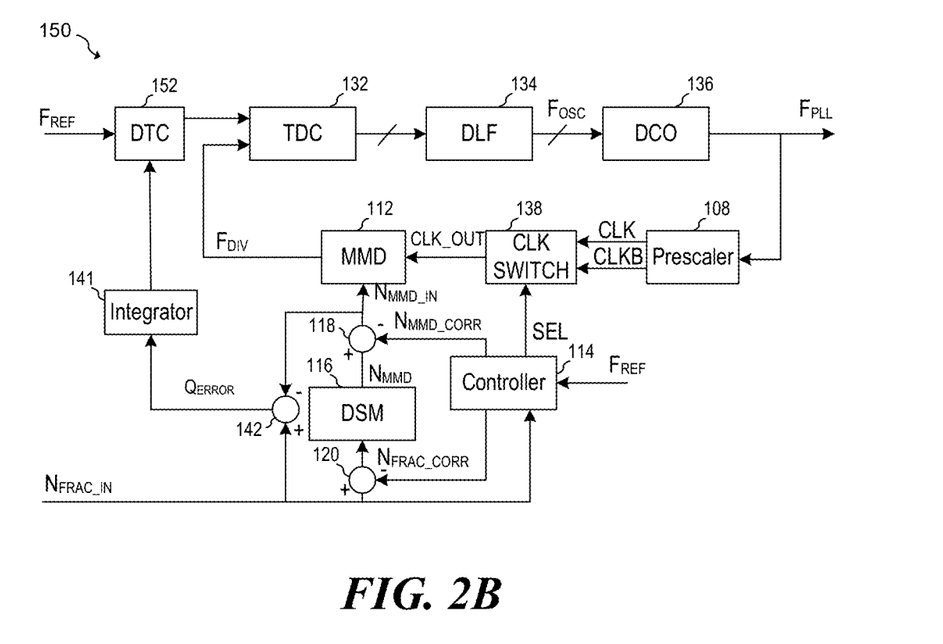

FIGS. 2A and 2B illustrate all digital PLLs (ADPLLs) according to embodiments of the present invention. FIG. 2A illustrates ADPLL 130. While some portions of ADPLL are similar to PLL 100 illustrated in FIG. 1A, the functions of phase detector 102, loop filter 104 and oscillator 106 illustrated in FIG. 1A are respectively implemented using time-to-digital converter (TDC) 132, digital loop filter (DFL) 134 and digitally controlled oscillator (DCO) 136. TDC 132 may be implemented using time-to-digital converter circuits and method known in the art, for example, using a Vernier interpolator or a tapped delay line; digital loop filter 104 may be implemented using a digital filter known in the art, such as a first order IIR digital filter, and DCO 136 may be implemented using DCO structures known in the art, such as an active LC oscillator (e.g. negative resistance oscillator or Colpitts oscillator) having a digitally selectable LC tank capacitance. It should be understood that these implementations for TDC 132, DLF 134 and DCO are just a few of many possible implementation examples for these circuits.

ADPLL 130 also includes a digital-to-time converter (DTC) 140 configured to apply an adjustable delay to the output of MMD 112 to compensate for the quantization error of DSM 116. In an embodiment, a quantization error signal $Q_{ERROR}$ is produced by subtracting the input $N_{MMD\_IN}$ of MMD 112 from the desired fractional division ratio $N_{FRAC\_IN}$ using digital subtractor 142. In various embodiments, more delay is provided by DTC 140 when quantization error signal $Q_{ERROR}$ indicates that MMD has a lower division ratio than desired fractional division ratio $N_{FRAC\_IN}$ in order to compensate for the earlier terminal count of MMD 112, and less delay is provided by DTC 140 when quantization error signal $Q_{ERROR}$ indicates that MMD has a higher division ratio than desired fractional division ratio $N_{FRAC\_IN}$ in order to compensate for the later terminal count of MMD 112. In some embodiments, integrator 141 integrates quantization error signal $Q_{ERROR}$ prior to its being used by DTC 140.

DTC 140 may be implemented using digital-to-time converter circuits known in the art including, but not limited to selectable delay lines of varying delay lengths and inverter chains having digitally selectable capacitive loads. Integrator 141 may be implemented using integrator circuits known in the art including, for example, an accumulator.

As shown, clock modifier 110 shown in FIG. 1A is implemented using a clock switching circuit 138 (also referred to as a "clock synchronizer circuit") that alternatively selects positive clock phase CLK and negative clock phase CLKB according to select signal SEL. In various embodiments, a non-integer number of clock cycles is removed from CLK_OUT whenever positive clock phase CLK is exchanged with negative clock phase CLKB as explained below with respect to FIGS. 3A and 3B. In alternative embodiments, clock switching circuit 138 may be implemented using other types of clock modification circuits configured to remove a non-integer number of clock cycles and/or may be implemented to switch between more than two clocks. For example, in a "quarter clock system," the positive and negative clock phases of two clocks having a 90 degree phase shift may be selected by clock modifier 110 in order to remove a non-integer number of clock cycles in increments of 0.25 clock cycles. Similarly, the positive and negative clock phases of four clocks having a 45 degree phase shift may be selected to by clock modifier 110 in order to remove a non-integer number of clock cycles in increments of 0.125 clock cycles. In general, the units of non-integer phase shift achievable can be represented as $\varphi_{ps}/360$, where $\varphi_{ps}$ is the phase shift between clocks.

FIG. 2B illustrates an ADPLL 150 according to a further embodiment. ADPLL 150 is similar to ADPLL 130 shown in FIG. 2A, with the exception that DTC 140 is used to provide a variable delay to reference clock $F_{REF}$ instead of the output of MMD 112 based on quantization error signal $Q_{ERROR}$. In various embodiments, more delay is provided by DTC 140 when quantization error signal $Q_{ERROR}$ or the integrated quantization error indicates that MMD 112 has a higher division ratio than desired fractional division ratio $N_{FRAC\_IN}$ in order to compensate for the later terminal count of MMD 112, and less delay is provided by DTC 140 when quantization error signal $Q_{ERROR}$ indicates that MMD has a lower division ratio than desired fractional division ratio $N_{FRAC\_IN}$ in order to compensate for the earlier terminal count of MMD 112.

DTC 140 may be implemented using digital-to-time converter circuits known in the art including, but not limited to selectable delay lines of varying delay lengths and inverter chains having digitally selectable capacitive loads. While DTC 140 and 150 are shown in the context of ADPLLs 130 and 150 illustrated in FIGS. 2A and 2B, it should be understood that DTCs also could be used compensate for DSM quantization error in a similar manner for PLL 100 shown in FIG. 1A. In some embodiments, a DTC may be used to delay the reference clock or the output of the MMD in in PLLs having a PFD, analog loop filter, and a voltage or current controlled oscillator.

Figure 3A:
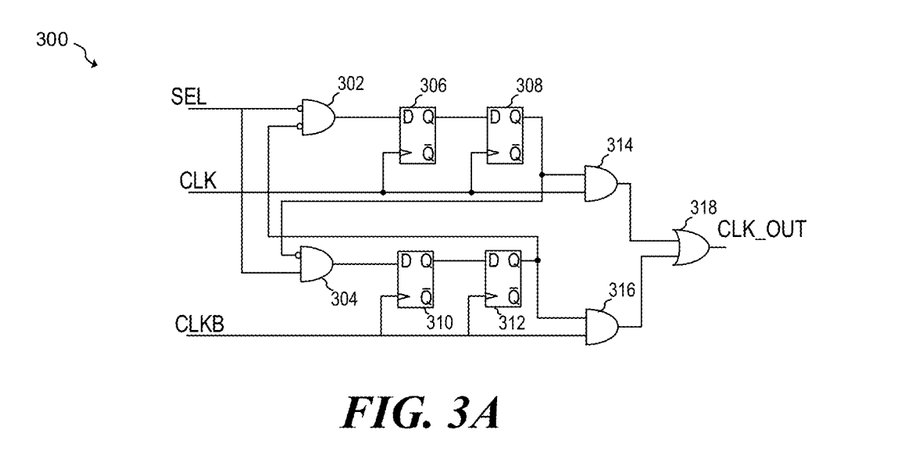
FIG. 3A illustrates a double synchronizer circuit according to an embodiment.

FIG. 3A illustrates a schematic of an embodiment double synchronizer circuit 300 according an embodiment of the present invention that can be used to implement clock switching circuit 138 shown in FIGS. 2A and 2B, as well as clock modifier 110 shown in FIG. 1A. As shown, double synchronizer 300 includes a first path that includes AND gate 302 with inverted input, flip-flops 306 and 308 and AND gate 314 that gates non-inverted clock signal CLK, and a second path that includes AND gate 304 with an inverted input, flip-flops 310 and 312 and AND gate 316 that gates inverted clock signal CLKB. The gated clock outputs of AND gates 314 and 316 are ORed together using OR gate 318 to produce clock signal CLK_OUT. It should be understood that double synchronizer circuit 300 shown in FIG. 3A is just one particular implementation example. During operation, double synchronizer 300 outputs non-inverted clock CLK when the select signal SEL is low, and outputs inverted clock signal CLKB when the select signal SEL is high. When the select signal SEL transitions from low to high, or from high to low, output clock CLK_OUT stops transitioning from 1.5 clock cycles between the times that non-inverted clock signal CLK is deactivated and inverted clock signal CLKB is activated and between the times that inverted clock signal CLKB is deactivated and non-inverted clock signal CLK is activated.

Figure 3B:
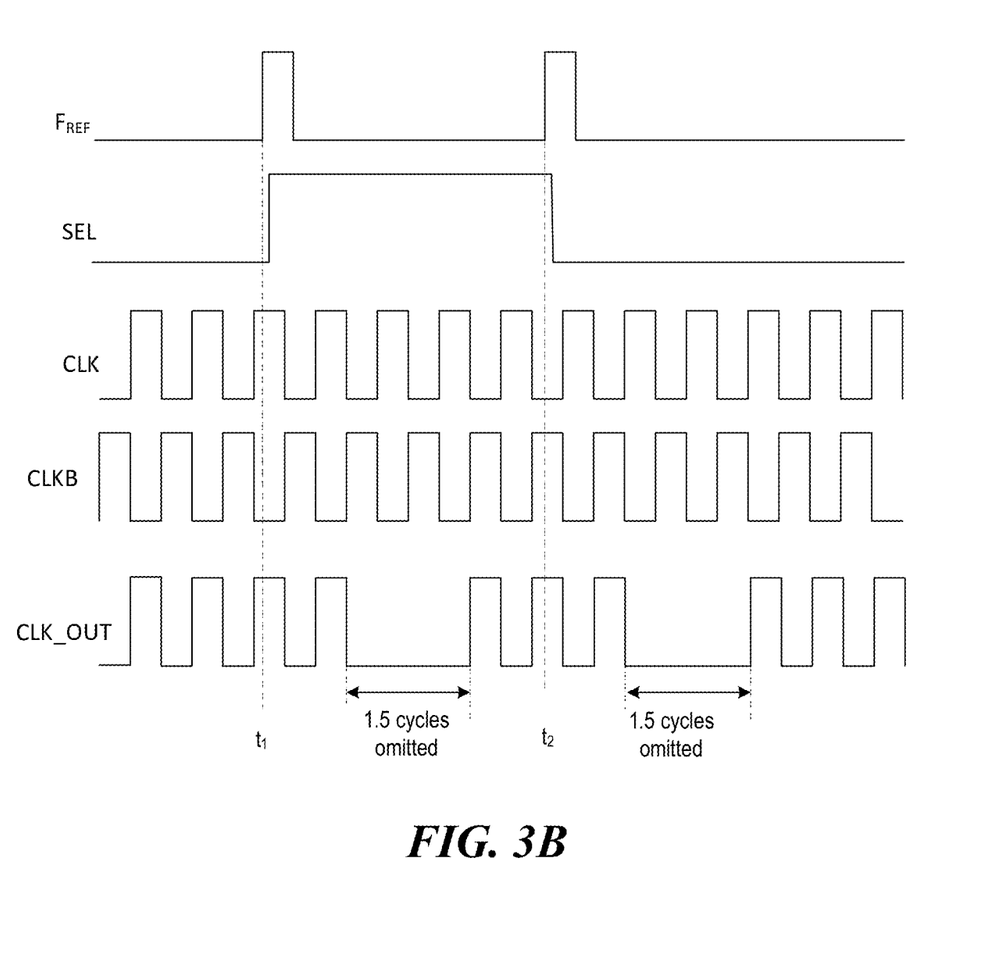
FIG. 3B illustrates a timing diagram of the double synchronizer circuit of FIG. 3A.

FIG. 3B illustrates a timing diagram showing the operation of double synchronizer 300. As shown, FIG. 3B shows reference clock $F_{REF}$, select signal SEL produced by controller 114 and input to double synchronizer 300, non-inverted input clock signal CLK and inverted clock signal CLKB provided to double synchronizer 300 from prescaler 108, and output clock signal CLK_OUT provided by double synchronizer 300 to MMD 112. When reference clock signal $F_{REF}$ is asserted at time $t_1$, select signal SEL changes state. As a result of select signal SEL changing state, double synchronizer 300 eliminates three transitions from output clock signal CLK_OUT as clock signals CLK and CLKB are switched, which results in 1.5 clock cycles being eliminated from output clock signal CLK_OUT. When the reference clock $F_{REF}$ is again asserted at time $t_2$, select signal SEL again changes state, which causes clock double synchronizer to eliminate a further three edge transitions from output clock signal CLK_OUT when clock signals CLK and CLKB are again switched. Operation continues in this manner at each successive assertion of reference clock signal $F_{REF}$ (e.g. between $t_1$ and $t_2$) when controller 114 configures double synchronizer to eliminate fractional clock cycles. As long as select signal SEL is configured to change state as successive assertions of reference clock signal $F_{REF}$, the operating point of DSM 116 is shifted according to the number of clock cycles removed during each reference clock period $F_{REF}$ (e.g. between $t_1$ and $t_2$). For example, when 1.5 clock cycles are removed, the operating point of DSM 116 is shifted by 1.5 via summer 120 and/or summer 118.

Figure 4:
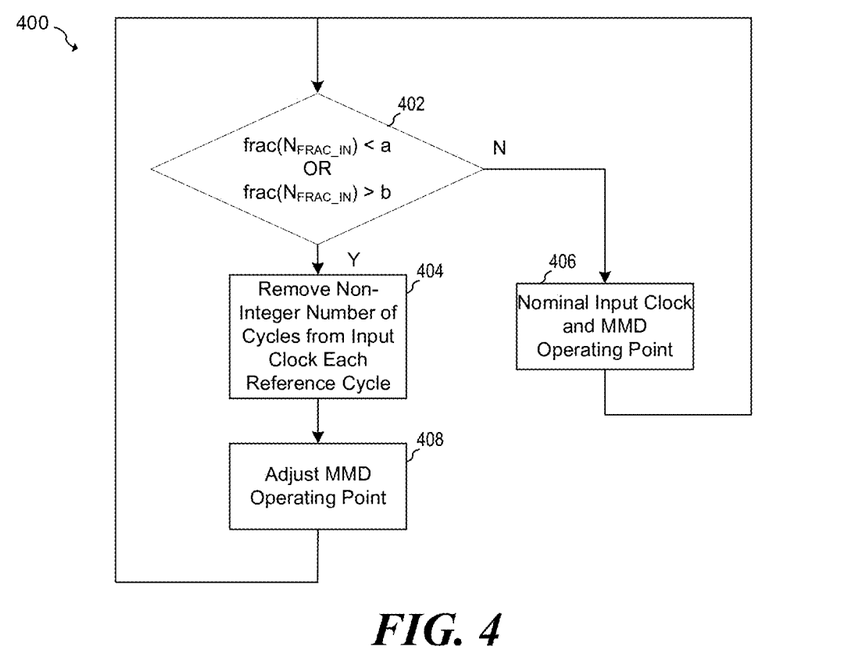
FIG. 4 illustrates a block diagram of a method of operating a FN-PLL according to an embodiment.

FIG. 4 illustrates a block diagram of an embodiment method 400 of operating a FN-PLL, such as FN-PLL 100 shown in FIG. 1 and ADPLLs 130 and 150 shown in FIGS. 2A and 2B. In step 402 a determination is made whether the fractional portion of desired fractional division ratio $N_{FRAC\_IN}$ is within a first range of values (e.g., less than first fractional limit value a or greater than second fractional limit value b). In various embodiments, step 402 may be implemented by controller 114 (FIGS. 1A, 2A and 2B) using one or more digital comparators. If the fractional portion of desired fractional division ratio $N_{FRAC\_IN}$ is within a first range of values, a non-integer number of clock cycles are removed from the input clock of MMD 112 during each reference clock cycle (step 404). These input clocks may be removed, for example, using clock modifier 110 shown in FIG. 1A and described in FIG. 1C, by clock switching circuit 138 shown in FIGS. 2A and 2B, and/or double synchronizer 300 shown and described in FIGS. 3A and 3B. In step 408, the operating point of the MMD 112 is adjusted when the non-integer number of clock cycles are being removed from the input clock of MMD 112. In various embodiments, the operating point is corrected by adding a fractional correction factor $N_{FRAC\_CORR}$ at the input to DSM 116 using summer 120 and an optional integer correction faction $N_{MMD\_CORR}$ to the output of DSM 116 using summer 118. For example, if 0.5 cycles are removed, from the input lock of MMD 112, the operating point of DSM 116 is shifted by 0.5 via summer 120. If 1.5 cycles are removed, the operating point of DSM 116 is shifted by applying 1 value of 1.5 to summer 120, or by applying a value of 0.5 to summer 120 and a value of 1.0 to summer 118.

On the other hand, if the fractional portion of desired fractional division ratio $N_{FRAC\_IN}$ is not a first range of values, fractional clock cycles are not removed from the input clock to MMD 112, and a nominal (e.g., uncorrected) operating point is used for DSM 116 (step 406).

Figure 5:
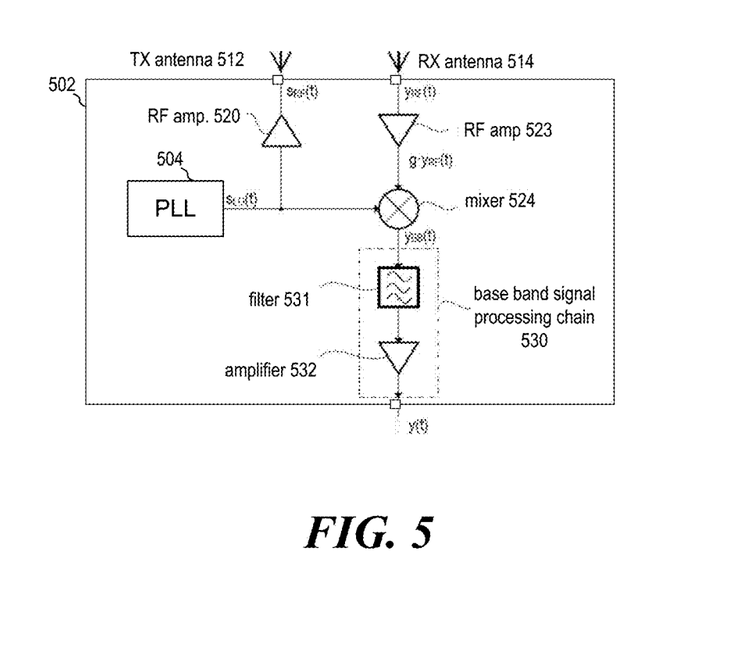
FIG. 5 illustrates a block diagram of a radar transceiver that utilizes an FN-PLL according to embodiments.

FIG. 5 illustrates an embodiment radar transceiver 502 that utilizes an embodiment PLL as described according to the various embodiments above. As shown, radar transceiver includes embodiment PLL 504 that generates an RF signal $s_{LO}(t)$, which may be frequency-modulated using frequency modulation techniques know in the art. For example, in a frequency modulated continuous wave (FMCW) radar system, RF signal $s_{LO}(t)$ may be frequency modulated to have a frequency ramp of increasing and/or decreasing frequency. In some embodiments, this frequency modulation may be achieved by varying the desired fractional division ratio $N_{FRAC\_IN}$ according to the desired modulation signal. For example, for a FMCW system, desired fractional division ratio $N_{FRAC\_IN}$ may be a ramped signal corresponding to the desired frequency chirps.

Alternatively, RF signal $s_{LO}(t)$ may be frequency modulated according to other shapes and patterns, such as rectangular and sinusoidal. In radar applications, the LO signal may be in the Super High Frequency (SHF) or the Extremely High Frequency (EHF) band (e.g., between 76 GHz and 81 GHz in automotive applications).

The LO signal $s_{LO}(t)$ is processed in the transmit signal path as well as in the receive signal path. The transmit signal $s_{RF}(t)$, which is radiated by the TX antenna 512, is generated by amplifying the LO signal $s_{LO}(t)$, for example, using an RF power amplifier 520. The output of the amplifier 520 is coupled to the TX antenna 512. The received signal $y_{RF}(t)$, which is provided by the RX antenna 514, is provided to a mixer 524. In the present example, the received signal $y_{RF}(t)$ (i.e., the antenna signal) is pre-amplified by RF amplifier 523 (gain g), so that the mixer receives the amplified signal $g \cdot y_{RF}(t)$ at its RF input. The mixer 524 further receives the LO signal $s_{LO}(t)$ at its reference input and is configured to down-convert the amplified signal $g \cdot y_{RF}(t)$ into the base band. The resulting base-band signal at the mixer output is denoted as $y_{BB}(t)$. The base-band signal $y_{BB}(t)$ is further processed by the analog base band signal processing chain 530, which basically includes one or more filters (e.g., a band-pass filter 531) to remove undesired side bands and image frequencies as well as one or more amplifiers such as amplifier 532. The analog output signal, which may be supplied to an analog-to-digital converter is denoted as y(t) radar transceiver 502.

In the present example, the mixer 524 down-converts the RF signal $g \cdot y_{RF}(t)$ (amplified antenna signal) into the base band. The respective base band signal (mixer output signal) is denoted by $y_{BB}(t)$. The down-conversion may be accomplished in a single stage (i.e., from the RF band into the base band) or via one or more intermediate stages (from the RF band into an IF band and subsequently into the base band). It should be understood that radar transceiver 502 is just one of many possible systems that may utilized PLLs according to embodiments of the present invention.

Embodiments of the present invention are summarized here. Other embodiments can also be understood from the entirety of the specification and the claims filed herein.

Example 1. A method of operating a fractional-N phase locked loop (FN-PLL), the method including: dividing a first clock signal using a multi-modulus divider (MMD) based on a modulus control signal to form a frequency-divided clock signal, where the first clock signal is based on an output clock of the PLL; generating the modulus control signal based on a divider control input value using a delta-sigma modulator (DSM); and when a fractional portion of the divider control input value is within a first range of values, and repeatedly removing a first number of clock cycles from the first clock signal before dividing the first clock signal using the MMD, where the first number of clock cycles is a non-integer number of clock cycles.

Example 2. The method of example 1, where: the first range of values includes fractional values between zero and a first fractional limit value, and between a second fractional limit value and one; and the method further includes modifying at least one of the first fractional limit value and the second fractional limit value during operation.

Example 3. The method of one of examples 1 or 2, further including correcting the modulus control signal according to the first number of clock cycles when the fractional portion of the divider control input value is within the first range of values.

Example 4. The method of one of examples 1 to 3, where correcting the modulus control signal includes at least one of: adding a first offset to the divider control input value or adding a second offset to the modulus control signal.

Example 5. The method of example 4, where the first offset includes an integer value and the second offset includes a fractional value.

Example 6. The method of one of examples 4 or 5, where: the first number of clock cycles is 1.5; the first offset is –0.5; and the second offset is –1.

Example 7. The method of one of examples 1 to 6, where the first range of values is between 0 and 0.25 and between 0.75 and 1.

Example 8. The method of one of examples 1 to 7, further including comparing the frequency-divided clock signal to a reference clock signal, the reference clock signal having reference clock intervals, where repeatedly removing the first number of clock cycles from the first clock signal includes removing the first number of clock cycles from the first clock signal during a reference clock interval.

Example 9. The method of one of examples 1 to 8, where repeatedly removing the first number of clock cycles includes switching between a non-inverted version of the first clock signal and an inverted version of the first clock signal.

Example 10. The method of one of examples 1 to 9, further including generating the first clock signal by dividing the output clock of the PLL by a prescaling factor.

Example 11. The method of one of examples 1 to 10, further including: comparing a phase of the frequency-divided clock signal with a phase of a reference clock signal to form a phase comparison signal; filtering the phase comparison signal; and controlling a frequency of an oscillator with the phase comparison signal, where the an output signal of the oscillator forms the output clock of the PLL.

Example 12. The method of example 11 where: comparing the phase of the frequency-divided clock signal with the phase of the reference clock signal includes using a time-to-digital converter; filtering the phase comparison signal includes using a digital filter; and controlling the frequency of the oscillator includes digitally controlling the frequency of the oscillator.

Example 13. A phase locked loop (PLL) including: a clock modification circuit having an input coupled to a clock output of the PLL, the clock modification circuit configured to remove a non-integer number of clock cycles from an input clock signal at its input based on a clock modification control signal; a multi-modulus divider (MMD) having an input coupled to an output of the clock modification circuit; a delta-sigma modulator (DSM) having an output coupled to a modulus control input of the MMD and an input configured to receive a divider input control value; an operating point modification circuit coupled to the DSM; and a controller configured to repeatedly assert the clock modification control signal when a fractional component of the divider input control value is within a first range of values, and to cause the operating point modification circuit adjust an operating point of the DSM to compensate for the removed non-integer number of clock cycles.

Example 14. The PLL of example 13, where the clock modification circuit is configured to switch between a non-inverted version of the clock input signal, and an inverted version of the clock input signal.

Example 15. The PLL of one of examples 13 or 14, where the clock modification circuit includes a clock synchronizer circuit and the controller is configured to repeatedly assert the clock modification control signal by changing a polarity of the clock modification control signal.

Example 16. The PLL of one of examples 13 to 15, where the controller is configured to assert the clock modification control signal when a reference clock signal provided to the PLL is asserted.

Example 17. The PLL of one of examples 13 to 16, where the operating point modification circuit includes a first summing circuit coupled the input of the DSM.

Example 18. The PLL of example 17, where the operating point modification circuit further includes a second summing circuit coupled between the output of the DSM and the modulus control input of the MMD.

Example 19. The PLL of one of examples 13 to 18, where the DSM is a digital multi-stage noise shaping (MASH) DSM.

Example 20. A phase locked loop (PLL) including: a phase comparison circuit configured to receive a reference clock signal at a first input; a filter coupled to an output of the phase comparison circuit; an oscillator having a frequency control input coupled to an output of the filter; a prescaler circuit coupled to an output of the oscillator; a clock synchronizer circuit coupled to the prescaler circuit, the clock synchronizer circuit configured to switch between a non-inverted output of the prescaler circuit and an inverted output of the prescaler circuit; a multi-modulus divider (MMD) having an input coupled to an output of the clock synchronizer circuit and an output coupled to a second input of the phase comparison circuit; a delta-sigma modulator (DSM) having an output coupled to a modulus control input of the MMD and configured to receive a divider input control signal; and a controller configured to, when the divider input control signal is within a first predetermined range of values, repeatedly cause the clock synchronizer circuit to switch between the non-inverted output of the prescaler circuit and the inverted output of the prescaler circuit, and add a non-integer offset to the divider input control signal received by the MMD.

Example 21. The PLL of example 20, where the controller is further configured to, when the divider input control signal is within the first predetermined range of values, to add an integer offset to the output of the output of the delta-sigma modulator provided to the input of the MMD.

Example 22. The PLL of one of examples 20 or 21, where the PLL is an all-digital PLL (ADPLL).

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of operating a fractional-N phase locked loop (FN-PLL), the method comprising:
 dividing a first clock signal using a multi-modulus divider (MMD) based on a modulus control signal to form a frequency-divided clock signal, wherein the first clock signal is based on an output clock of the PLL;

generating the modulus control signal based on a divider control input value using a delta-sigma modulator (DSM); and
when a fractional portion of the divider control input value is within a first range of values,
repeatedly removing a first number of clock cycles from the first clock signal before dividing the first clock signal using the MMD, wherein the first number of clock cycles is a non-integer number of clock cycles.

2. The method of claim 1, wherein:
the first range of values comprises fractional values between zero and a first fractional limit value, and between a second fractional limit value and one; and
the method further comprises modifying at least one of the first fractional limit value and the second fractional limit value during operation.

3. The method of claim 1, further comprising correcting the modulus control signal according to the first number of clock cycles when the fractional portion of the divider control input value is within the first range of values.

4. The method of claim 1, wherein correcting the modulus control signal comprises at least one of: adding a first offset to the divider control input value or adding a second offset to the modulus control signal.

5. The method of claim 4, wherein the first offset comprises an integer value and the second offset comprises a fractional value.

6. The method of claim 5, wherein:
the first number of clock cycles is 1.5;
the first offset is −0.5; and
the second offset is −1.

7. The method of claim 1, wherein the first range of values is between 0 and 0.25 and between 0.75 and 1.

8. The method of claim 1, further comprising comparing the frequency-divided clock signal to a reference clock signal, the reference clock signal having reference clock intervals, wherein repeatedly removing the first number of clock cycles from the first clock signal comprises removing the first number of clock cycles from the first clock signal during a reference clock interval.

9. The method of claim 1, wherein repeatedly removing the first number of clock cycles comprises switching between a non-inverted version of the first clock signal and an inverted version of the first clock signal.

10. The method of claim 1, further comprising generating the first clock signal by dividing the output clock of the PLL by a prescaling factor.

11. The method of claim 1, further comprising:
comparing a phase of the frequency-divided clock signal with a phase of a reference clock signal to form a phase comparison signal;
filtering the phase comparison signal; and
controlling a frequency of an oscillator with the phase comparison signal, wherein the an output signal of the oscillator forms the output clock of the PLL.

12. The method of claim 11, wherein:
comparing the phase of the frequency-divided clock signal with the phase of the reference clock signal comprises using a time-to-digital converter;
filtering the phase comparison signal comprises using a digital filter; and
controlling the frequency of the oscillator comprises digitally controlling the frequency of the oscillator.

13. A phase locked loop (PLL) comprising:
a clock modification circuit having an input coupled to a clock output of the PLL, the clock modification circuit configured to remove a non-integer number of clock cycles from an input clock signal at its input based on a clock modification control signal;
a multi-modulus divider (MMD) having an input coupled to an output of the clock modification circuit;
a delta-sigma modulator (DSM) having an output coupled to a modulus control input of the MMD and an input configured to receive a divider input control value;
an operating point modification circuit coupled to the DSM; and
a controller configured to repeatedly assert the clock modification control signal when a fractional component of the divider input control value is within a first range of values, and to cause the operating point modification circuit adjust an operating point of the DSM to compensate for the removed non-integer number of clock cycles.

14. The PLL of claim 13, wherein the clock modification circuit is configured to switch between a non-inverted version of the clock input signal, and an inverted version of the clock input signal.

15. The PLL of claim 14, wherein the clock modification circuit comprises a clock synchronizer circuit and the controller is configured to repeatedly assert the clock modification control signal by changing a polarity of the clock modification control signal.

16. The PLL of claim 13, the controller is configured to assert the clock modification control signal when a reference clock signal provided to the PLL is asserted.

17. The PLL of claim 13, wherein the operating point modification circuit comprises a first summing circuit coupled the input of the DSM.

18. The PLL of claim 17, wherein the operating point modification circuit further comprises a second summing circuit coupled between the output of the DSM and the modulus control input of the MMD.

19. The PLL of claim 13, wherein the DSM is a digital multi-stage noise shaping (MASH) DSM.

20. A phase locked loop (PLL) comprising:
a phase comparison circuit configured to receive a reference clock signal at a first input;
a filter coupled to an output of the phase comparison circuit;
an oscillator having a frequency control input coupled to an output of the filter;
a prescaler circuit coupled to an output of the oscillator;
a clock synchronizer circuit coupled to the prescaler circuit, the clock synchronizer circuit configured to switch between a non-inverted output of the prescaler circuit and an inverted output of the prescaler circuit;
a multi-modulus divider (MMD) having an input coupled to an output of the clock synchronizer circuit and an output coupled to a second input of the phase comparison circuit;
a delta-sigma modulator (DSM) having an output coupled to a modulus control input of the MMD and configured to receive a divider input control signal; and
a controller configured to, when the divider input control signal is within a first predetermined range of values, repeatedly cause the clock synchronizer circuit to switch between the non-inverted output of the prescaler circuit and the inverted output of the prescaler circuit, and add a non-integer offset to the divider input control signal received by the MMD.

21. The PLL of claim 20, wherein the controller is further configured to, when the divider input control signal is within the first predetermined range of values, to add an integer offset to the output of the output of the delta-sigma modulator provided to the input of the MMD.

22. The PLL of claim 20, wherein the PLL is an all-digital PLL (ADPLL).

* * * * *